(12) United States Patent  (10) Patent No.: US 9,123,389 B1
Park  (45) Date of Patent: Sep. 1, 2015

(54) MEMORY DEVICE, METHOD OF REFRESHING THE SAME, AND SYSTEM INCLUDING THE SAME

(71) Applicant: Chul Woo Park, Yongin-si (KR)

(72) Inventor: Chul Woo Park, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/139,323

(22) Filed: Dec. 23, 2013

Related U.S. Application Data

(60) Provisional application No. 61/740,706, filed on Dec. 21, 2012.

(51) Int. Cl.
*G11C 7/00* (2006.01)
(52) U.S. Cl.
CPC ........................................ *G11C 7/00* (2013.01)
(58) Field of Classification Search
CPC .......................... G11C 5/147; G11C 11/40615
USPC .............................................. 365/189.07, 222
See application file for complete search history.

(56) References Cited

U.S. PATENT DOCUMENTS

| | | | |
|---|---|---|---|
| 5,644,545 A | 7/1997 | Fisch | |
| 5,777,921 A | 7/1998 | Takata et al. | |
| 7,619,944 B2 | 11/2009 | Fisch et al. | |
| 8,009,498 B2 * | 8/2011 | Chang et al. | 365/222 |
| 8,094,512 B2 | 1/2012 | Fukiage | |
| 2007/0033339 A1 | 2/2007 | Best et al. | |
| 2007/0070764 A1 | 3/2007 | Miyamoto et al. | |
| 2007/0183242 A1 * | 8/2007 | Miyamoto | 365/222 |
| 2008/0151669 A1 * | 6/2008 | Bill et al. | 365/222 |
| 2009/0190409 A1 * | 7/2009 | Dittrich et al. | 365/185.25 |
| 2010/0165692 A1 | 7/2010 | Jeddeloh | |
| 2011/0107022 A1 | 5/2011 | Gray et al. | |
| 2011/0110175 A1 * | 5/2011 | Chang et al. | 365/222 |
| 2011/0122687 A1 | 5/2011 | Kwon et al. | |
| 2012/0287727 A1 | 11/2012 | Wang | |
| 2014/0095780 A1 | 4/2014 | Bains et al. | |

* cited by examiner

*Primary Examiner* — Michael Tran
(74) *Attorney, Agent, or Firm* — Muir Patent Law, PLLC

(57) ABSTRACT

A method of refreshing a memory device includes counting the number of accesses to each of a plurality of memory blocks, comparing the counted numbers of accesses resulting from the counting with a first reference count, and performing an additional refresh operation on a corresponding memory block according to a comparison result.

17 Claims, 14 Drawing Sheets

MEMORY DEVICE, METHOD OF REFRESHING THE SAME, AND SYSTEM INCLUDING THE SAME

CROSS-REFERENCE TO RELATED APPLICATIONS

This application claims the priority benefit of U.S. provisional patent application No. 61/740,706 filed on Dec. 21, 2012, the disclosure of which is hereby incorporated by reference in its entirety.

BACKGROUND

Embodiments of disclosed herein relate to a method of refreshing a memory device, and more particularly, to a memory device for performing an additional refresh operation on a memory block having the number of accesses exceeding a reference count, a refresh method of the same, and a system including the same.

A memory device performs a refresh operation to prevent data stored in memory cells included in the memory device from being lost due to leakage. The cycle of a normal refresh operation periodically performed in the memory device is related with a data retention time of the memory cells.

SUMMARY

According to some embodiments of the inventive concept, there is provided a method of refreshing a memory device. The method of refreshing a memory device may comprise, for each of a plurality of memory blocks of the memory device: counting a number of accesses to the memory block; comparing the counted number of accesses resulting from the counting with a first reference count; and performing an additional refresh operation of the memory block in response to the comparing.

The method may further comprise performing a normal refresh operation according to a schedule of the plurality of memory blocks, wherein the additional refresh operation is performed while a normal refresh operation is being performed.

The additional refresh operation may use an address used to perform the normal refresh operation.

The performing the additional refresh operation may comprise generating a start signal for starting the additional refresh operation on the corresponding memory block when the counted number of accesses to the corresponding memory block is equal to or greater than the first reference count according to the comparison result.

The performing the additional refresh operation may comprise counting a number of sequential additional refresh operations after generating the start signal.

The performing the additional refresh operation may comprise comparing the counted number of additional refresh operations with a number equal to a number of word lines in the corresponding memory block.

The counted number of additional refresh operations may be reset upon determining the counted number of accesses to the corresponding memory block is equal to or greater than the first reference count according to the comparison result.

The method may further comprise comparing the counted number of accesses with a second reference count during a reference time; and resetting the counted number of accesses according to the comparison result of the counted number of accesses with the second reference count during the reference time. The second reference count may be less than the first reference count.

The resetting the counted number of accesses may comprise resetting the counted number of accesses only when no additional refresh operation is performed during the reference time.

A memory device may comprise a plurality of memory blocks; a local additive refresh start control circuit configured to compare a number of accesses of each of a the plurality of memory blocks with a first reference count and to generate a corresponding start signal according to the corresponding comparison result; and a local additive refresh control signal generator configured to generate a plurality of control signals, each control signal configured to cause an additional refresh operation on a corresponding one of the memory blocks according to the corresponding start signal.

The local additive refresh control signal generator may be configured to cause the additional refresh operation to be performed while a normal refresh operation is being performed.

The additional refresh operation may be performed by memory block.

The local additive refresh start control circuit may be configured to generate a detection signal indicating whether the number of accesses exceeds the first reference count according to the comparison result.

A local additive refresh end control circuit may be configured to count a number of sequential additional refresh operations performed in response to the generation of the detection signal and to generate an end signal for terminating further additional refresh operations according to the count.

Memory systems may comprise the memory devices described herein and a memory controller configured to control the memory device.

A method of refreshing a memory device comprising a plurality of memory blocks, each memory block comprising a plurality of rows may comprise performing normal refresh operations comprising refreshing the plurality of rows according to a predetermined sequence; monitoring accesses of the memory blocks; and performing additional refresh operations of a first memory block of the memory blocks when the accesses of the first memory block exceed a threshold.

The predetermined sequence may be determined by a refresh counter circuit generating refresh row addresses for the normal refresh operations.

The method my comprise using at least part of the refresh row addresses output by the refresh counter circuit to perform the additional refresh operations.

The method may comprise refreshing a second memory block according to the predetermined sequence of the normal refresh operations at the same time as refreshing the first memory block according to the additional refresh operations.

The method may comprise refreshing a first row of the first memory block simultaneously with refreshing a second row of the second memory block.

BRIEF DESCRIPTION OF THE DRAWINGS

The above and other features and advantages of the inventive concept will become more apparent by describing in detail exemplary embodiments thereof with reference to the attached drawings in which.

DETAILED DESCRIPTION OF THE EMBODIMENTS

Figure 1:
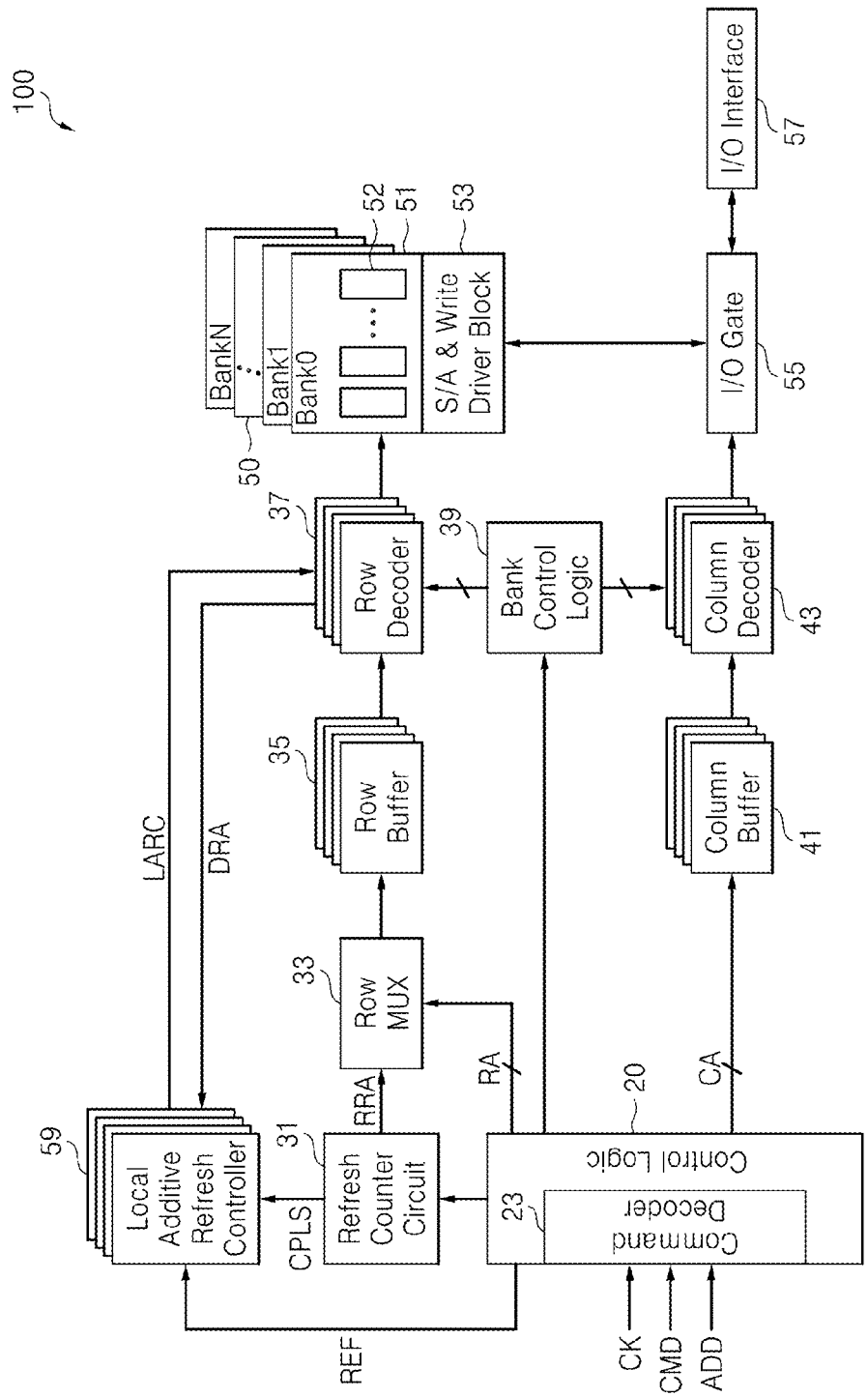
FIG. 1 is a block diagram of a memory device according to some embodiments of the inventive concept.

The inventive concept now will be described more fully hereinafter with reference to the accompanying drawings, in which embodiments of the invention are shown. This invention may, however, be embodied in many different forms and should not be construed as limited to the embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a memory device 100 according to some embodiments of the inventive concept. The memory device 100 may comprise a dynamic random access memory (DRAM), but the inventive concept is not restricted thereto.

The memory device 100 may include a control logic circuit 20, a refresh counter circuit 31, a row multiplexer (MUX) 33, a plurality of row buffers 35, a plurality of row decoders 37, a bank control logic circuit 39, a plurality of column buffers 41, a plurality of column decoders 43, a plurality of banks 50, an input/output (I/O) gate 55, an I/O interface 57, and a plurality of local additive refresh controllers 59.

The control logic 20 may control elements (e.g., the refresh counter circuit 31, the row MUX 33, the bank control logic 39, the column buffers 41, and/or the local additive refresh controllers 59) in response to a plurality of signals (e.g., a clock signal CK, a command signal CMD, and an address signal ADD). The command signal CMD may be a combination of a plurality of commands CS, RAS, CAS, and/or WE. The command signal CMD and the address signal ADD may be transmitted from a memory controller (not shown) that controls the memory device 100.

The control logic 20 may transmit a refresh signal REF, which enables a refresh operation to be counted, to the local additive refresh controllers 59. The control logic 20 may include a command decoder 23. In other embodiments, the command decoder 23 may be implemented outside the control logic 20. However, the inventive concept is not restricted to these embodiments.

The command decoder 23 may decode the command signal CMD composed of the combination of the commands CS, RAS, CAS, and/or WE based on the clock signal CL and generate a command and/or an address for controlling each element (e.g., the refresh counter circuit 31, the row MUX 33, the bank control logic 39, or the column buffers 41) according to the decoding result. The command decoder 23 may also decode the command signal CMD to generate a refresh command (e.g., an auto-refresh command) for executing a refresh operation.

The refresh counter circuit 31 may generate a refresh row address RRA in response to the refresh command output from the command decoder 23. The refresh counter circuit 31 may transmit a pulse signal CPLS, which is synchronized with a counting operation of the refresh counter circuit 31, to each of the local additive refresh controllers 59. The refresh counter circuit 31 may include a separate pulse generator (not shown) that generates the pulse signal CPLS. The pulse signal CPLS may be used by the local additive refresh controllers 59 as a reference window of time to reflect a frequency of access of an associated memory block 52

The row MUX 33 may select one of the refresh row address RRA generated by the refresh counter circuit 31 and a row address RA output from the control logic 20. During a refresh operation, the row MUX 33 may select the refresh row address RRA generated by the refresh counter circuit 31. During a normal memory access operation such as a read operation or a write operation, the row MUX 33 may select the row address RA output from the control logic 20.

The row buffers 35 may buffer a row address output from the row MUX 33. The row buffers 35 may be implemented as a single row buffer, but the inventive concept is not restricted thereto.

One of plural row decoders 37 corresponding to one of Bank0 to BankN of banks 50 may be selected by the bank control logic 39 and may decode a row address output from a corresponding one of row buffers 35. The row decoders 37 may be implemented as a single row decoder, but the inventive concept is not restricted thereto.

The row decoders 37 may transmit a decoded row address DRA to the local additive refresh controllers 59. For example, each of the memory blocks 52 may be uniquely identified and therefore selected by several of the most significant bits of the row address. A corresponding decoded row address DRA may be generated whenever its associated memory block 52 is identified by a row address during access of the memory array. Such decoded row address DRA may be sent to a corresponding local additive refresh controller 59. For example, there may be local additive refresh controller 59 provided for each memory block 52 (e.g., if there are 8 memory blocks in each of four memory banks, there may be 32 local additive refresh controllers 59). Each decoded row address DRA associated with a different memory block 52 may be sent on a different signal line to a corresponding local additive refresh controller 59. The row decoders 37 may also perform a local additive refresh (LAR) operation in response to a local additive refresh (LAR) control signal LARC received from the LAR controllers 59.

The LAR operation may be one or more additional refresh operations performed on a memory block having a large number of accesses during normal refresh operations. Normal refresh operations are performed periodically for each of the memory blocks 52 included in each of banks Bank0 through BankN. The normal refresh operations may be an auto-refresh operation, for example.

When a memory block 52 has a large number of accesses, data in dynamic weak cells and/or dynamic weak rows included in that memory block 52 may be maintained by the LAR operation. The dynamic weak cell may be a memory cell whose retention time is reduced by the disturbance or interference of adjacent cells. The dynamic weak row may be a row including the dynamic weak cell.

The bank control logic 39 may select some banks 50 to be refreshed among the banks 50 which may be responsive to control logic 20.

Each of the column buffers 41 may buffer a column address CA output from the control logic 20. The column buffers 41 may be implemented as a single column buffer, but the inventive concept is not restricted thereto.

One of the column decoders 43 corresponding to a bank 50 selected by the bank control logic 39 may decode the column address CA output from a corresponding column buffer 41. The column decoders 43 may be implemented as a single column decoder, but the inventive concept is not restricted thereto.

Each of the banks 50 (Bank0 through BankN) may include one of the memory cell arrays 51 and a sense amplifier (S/A) and write driver block 53. For clarity of the description, it is illustrated that each of the banks 50 is implemented in a different layer in FIG. 1, but the inventive concept should not be construed as limited to the structure and arrangement of the banks 50.

Each memory cell array 51 may include a plurality of memory blocks 52. Each of the memory blocks 52 may include a plurality of word lines (or row lines), a plurality of bit lines (or column lines), and a plurality of memory cells connected to the word lines and the bit lines to store data.

The S/A and write driver block 53 may sense and amplify a voltage change in the bit lines during a read operation of the memory device 100. The S/A and write driver block 53 may also function as a write driver that drives the bit lines during the write operation of the memory device 100.

The I/O gate 55 may transmit data or signals from the S/A and write driver block 53 to the I/O interface 57 in response to a column selection signal output from one of the column decoders 43. The I/O gate 55 may also transmit data or signals from the I/O interface 57 to the S/A and write driver block 53 in response to the column selection signal.

The I/O interface 57 may interface data between the memory device 100 and external devices. The LAR controllers 59 may count the number of accesses of each of the memory blocks 52 based on the respective decoded row addresses DRA received from the row decoders 37. In this case, each of the LAR controllers 59 may be dedicated to one of the memory blocks 52.

The group of LAR controllers 59 may be implemented as a single circuit corresponding to all of the memory blocks 52. Each of the LAR controllers 59 may also transmit the LAR control signal LARC to each of the row decoders 37 so that a LAR operation is performed on each of the memory blocks 52 according to the number of accesses that has been counted.

Each of the LAR controllers 59 may have certain internal circuits reset, such as counter circuits, based on the pulse signal CPLS received from the refresh counter circuit 31 and/or the refresh signal REF received from the control logic 20. The LAR controllers 59 will be described in detail with reference to FIGS. 2 through 5 below.

Figure 2:
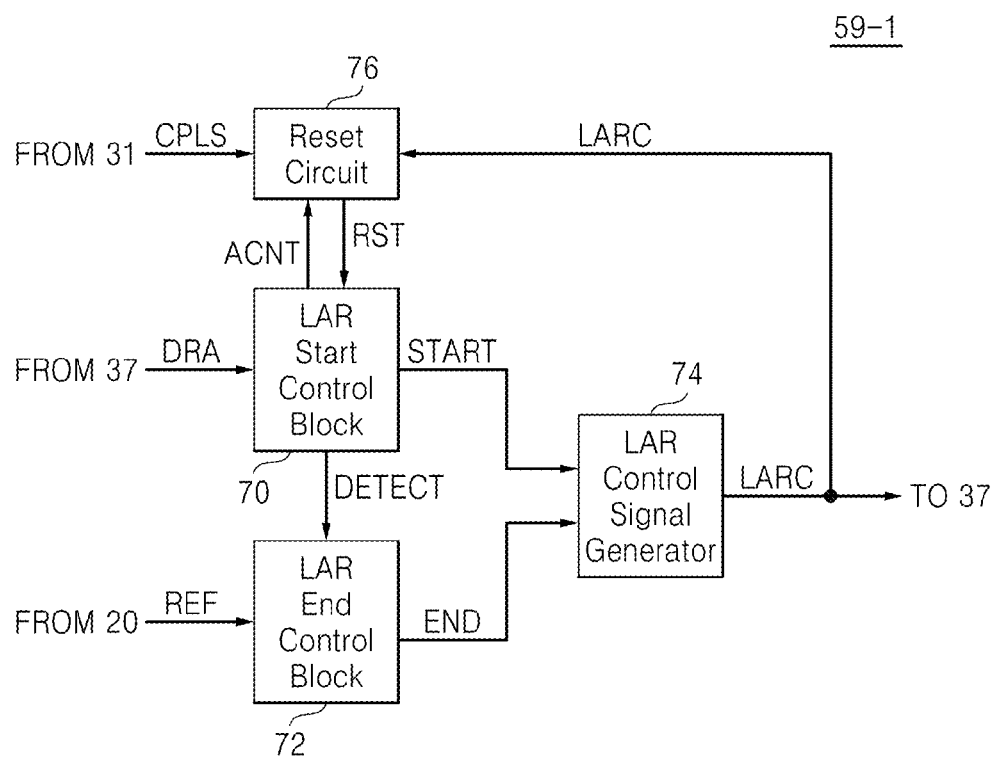
FIG. 2 is a block diagram of a local additive refresh controller illustrated in FIG. 1 according to some embodiments of the inventive concept.

FIG. 2 is a block diagram of one 59-1 of the LAR controllers 59 illustrated in FIG. 1 according to some embodiments of the inventive concept. Each of the LAR controllers 59 may be dedicated to a corresponding memory block 52. Referring to FIGS. 1 and 2, the LAR controller 59-1 may include a LAR start control circuit 70, a LAR end control circuit 72, a LAR control signal generator 74, and a reset circuit 76.

The LAR start control block 70 may receive the corresponding decoded row address DRA identifying the corresponding memory block 52 and may count the number of accesses the corresponding memory block 52 based on the decoded row address DRA. The LAR start control block 70 may include counters (not shown in FIG. 2) that count the number of accesses. The LAR start control block 70 may compare a result of counting the number of accesses (hereinafter, referred to as the "access count value") with a first reference count and may generate a start signal START and a detection signal DETECT according to the comparison result. The first reference count may be a threshold value on which the start of a LAR operation is based.

The start signal START may initiate a LAR operation. The detection signal DETECT may reset and/or activate or enable the LAR end control block 72. The start signal START and the detection signal DETECT may be substantially the same signal and may be enabled when the access count value is equal to or greater than the first reference count.

The LAR start control block 70 may transmit an access count ACNT which may reflect the access count value to the reset circuit 76 and may reset the access count value in response to a reset signal RST received from the reset circuit 76. The reset signal RST will be described in detail with reference to FIG. 5.

The LAR end control block 72 may count the number of LAR operations performed on the corresponding memory block 52 (the LAR end control block 72 may generate a corresponding "LAR count value"). After the access count value for the corresponding memory block 52 exceeds the first reference count, the DETECT signal may be generated by the LAR start control block 70 to reset the LAR count value. When enabled by the DETECT signal, each received refresh signal REF may correspond to a LAR operation and may increment the count of the LAR end control block. The LAR end control block 72 may generate an end signal END for terminating the LAR operation according to a result of counting the number of LAR operations (i.e., according to the LAR count value).

After receiving the detection signal DETECT, the LAR end control block 72 may count the number of LAR operations based on the refresh signal REF. When the LAR count value is the same as a reference value corresponding to a number of rows of the corresponding memory block 52, the LAR end control block 72 may generate the end signal END. The reference value may correspond to the size of the memory blocks 52 and may be the same as the number of word lines included in the memory blocks 52. The structure and the operations of the LAR end control block 72 will be described in detail with reference to FIG. 4 later.

The LAR control signal generator 74 may generate the LAR control signal LARC from the receipt of start signal START and to the receipt of the end signal END. The LAR control signal generator 74 may transmit the LAR control signal LARC to a corresponding one of the row decoders 37 and the reset circuit 76. Transmission of the LAR control signal LARC from the local additive refresh controller 59 to the corresponding one of the row decoders 37 may cause the row decoder to activate and thus refresh the memory block 52 associated with the local additive refresh controller 59.

The LAR control signal LARC may cause additional or additive refresh operations on the memory block 52 having the access count value exceeding the first reference count. These additive refresh operations may be in addition to normal refresh operations on the memory block 52 (e.g., in addition to normal auto refresh operations scheduled to occur during a refresh cycle). Also, these additive refresh operations may occur at the same time as normal refresh operations are being performed on another memory block 52. The LAR control signal LARC may cause some bits of the refresh row address RRA used for a refresh operation to be processed as "don't care" bits to activate the memory block 52 corresponding to the local additive refresh controller 59 that outputs the LAR control signal LARC (which is a memory block 52 having the access count value exceeding the first reference count) thereby causing the corresponding row decoder 37 to activate a row of such memory block 52 and the row identified by refresh row address RRA (causing simultaneous refresh of a row in the memory block 52 and the memory block associated with the normal refresh operation). As the row address RRA is incremented by the refresh counter circuit 31, both the memory block 52 associated with the normal refresh operation and the memory block 52 corresponding to the output LAR control signal LARC may have multiple rows refreshed (e.g., those rows in these memory blocks 52 identified by the lower significant bits of the refresh row address). As the refresh row address RRA increments to identify a row of a different memory block associated with the normal refresh operation, the LAR control signal LARC may still be activated to cause the corresponding row decoder 37 to activate the first row of the memory block associated with the local additive refresh controller 59 outputting the LAR control signal LARC (and having an access count value for the corresponding memory block 52 that exceeds the first reference count). Thus, even if the LAR control signal LARC is activated midway through the normal refresh operation of rows of a memory block 52, all rows of the memory block 52 associated with the local additive refresh controller 59 outputting the LAR control signal LARC may have an additive refresh operation performed.

The reset circuit 76 may generate the reset signal RST based on the pulse signal CPLS, the access count ACNT, and the LAR control signal LARC. The reset circuit 76 will be described in detail with reference to FIG. 5 later.

Figure 3:
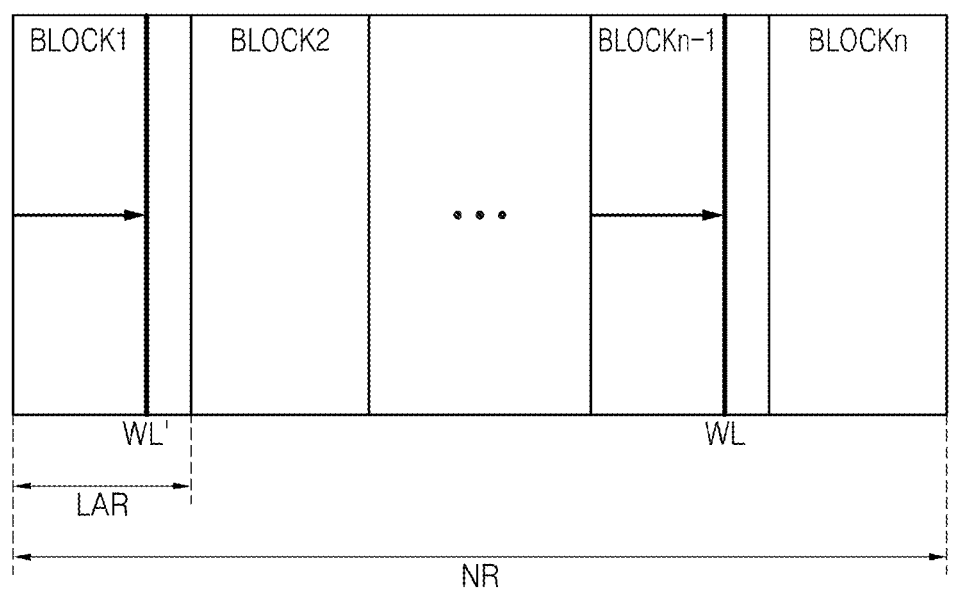
FIG. 3 is a diagram for explaining a method of performing a local additive refresh operation according to the control of the local additive refresh controller illustrated in FIG. 2.

FIG. 3 is a diagram for explaining a method of performing a LAR operation according to the control of the LAR controller 59-1 illustrated in FIG. 2. Referring to FIGS. 2 and 3, the memory cell array 51 may include a plurality of memory blocks BLOCK1 through BLOCKn.

While a normal refresh operation NR is being performed on a word line WL in the (n–1)-th memory block BLOCKn–1, a LAR operation LAR may be performed on a word line WL' in the first memory block BLOCK1 when BLOCK1 has an access count value exceeding the first reference count. For clarity of description, it is illustrated that each of the normal refresh operation NR and the LAR operation LAR is performed on only one word line WL or WL' at a time in FIG. 3, however, the scope of the inventive concept should not be construed as restricted by the number of refreshed word lines.

The normal refresh operation NR may be sequentially performed on all of the memory blocks BLOCK1 through BLOCKn. Accordingly, after the normal refresh operation NR is finished with respect to the (n–1)-th memory block BLOCKn–1, the normal refresh operation NR may be subsequently performed on the n-th memory block BLOCKn. However, the LAR operation may be locally performed only on an identified memory block (e.g., the first memory block BLOCK10 having an access count value exceeding the first reference count).

Thereafter, when there is another memory block having the access count value exceeding the first reference count, the LAR operation may be performed on that memory block.

Figure 4:
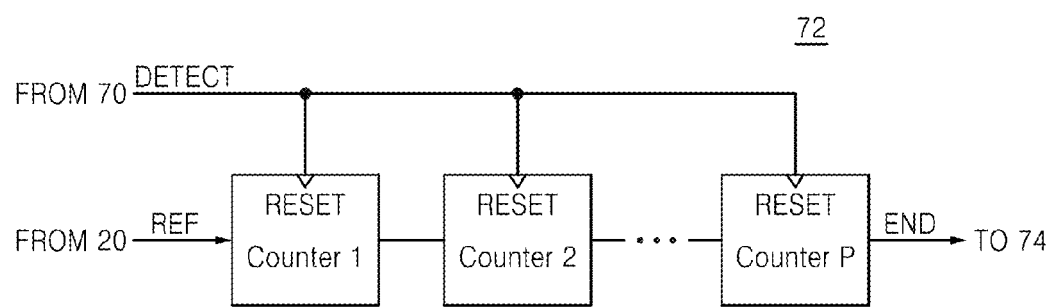
FIG. 4 is a block diagram of a local additive refresh (LAR) end control block illustrated in FIG. 2 according to some embodiments of the inventive concept.

FIG. 4 is a block diagram of the LAR end control block 72 illustrated in FIG. 2 according to some embodiments of the inventive concept. Referring to FIGS. 2 and 4, the LAR end control block 72 may comprise a counter including a plurality of smaller counters serially connected together.

The first through P-th counters are reset in response to the detection signal DETECT. After being reset, the first through P-th counters may count the number of LAR operations based on the refresh signal REF. In this example, LAR operations are performed concurrently with normal refresh operations enabled by the refresh signal REF. The first through P-th counters may include an enable terminal and may be enabled according to the detection signal DETECT input through the enable terminal.

The P-th counter may generate a most significant bit (MSB) of a count value resulting from the operation of the first through P-th counters together. When the LAR count value is equal to or greater than a reference value (corresponding to a number of rows in a memory block 52, e.g.), the MSB of the count value may be changed. At this time, the end signal END output from the P-th counter may be enabled.

Figure 5:
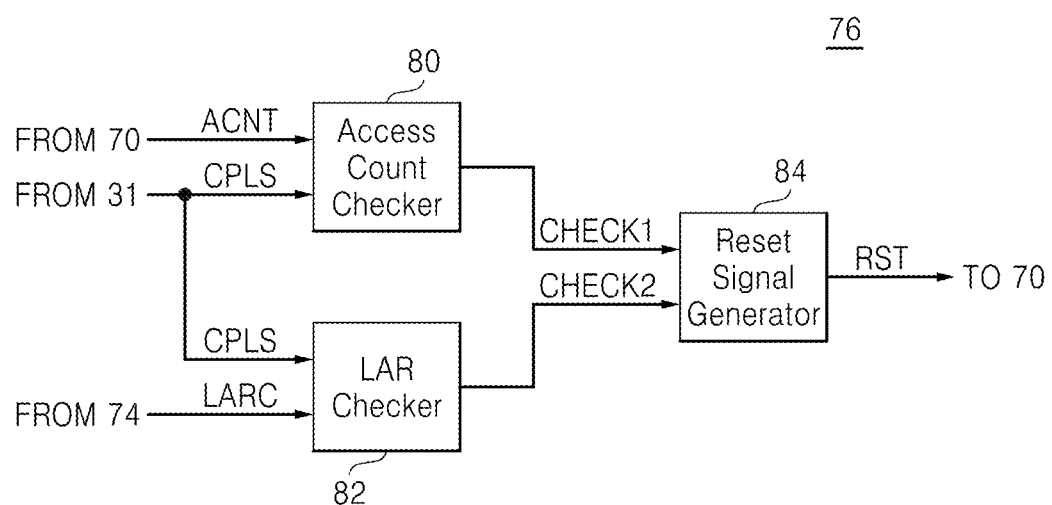
FIG. 5 is a block diagram of a reset circuit illustrated in FIG. 2 according to some embodiments of the inventive concept.

FIG. 5 is a block diagram of the reset circuit 76 illustrated in FIG. 2 according to some embodiments of the inventive concept. Referring to FIGS. 2 and 5, the reset circuit 76 may include an access count checker 80, a LAR checker 82, and a reset signal generator 84.

The access count checker 80 may check whether the access count ACNT output from the LAR start control block 70 exceeds a second reference count during a reference time. According to the check result, the access count checker 80 may generate a first check signal CHECK1. The reference time may be determined based on the pulse signal CPLS.

The access count checker 80 may enable the first check signal CHECK1 when the access count ACNT is less than the second reference count during the reference time. In other words, the access count checker 80 may determine that a LAR operation is unnecessary when the access count ACNT is less than the second reference count and generate the enabled first check signal CHECK1.

Alternatively, the access count checker 80 may enable the first check signal CHECK1 when there is no change in the upper two bits of the access count ACNT during the reference time. The second reference count is less than the first reference count used in the LAR start control block 70.

The LAR checker 82 may check whether any LAR operation has been performed during a reference time. According to the check result, the LAR checker 82 may generate a second check signal CHECK2. Whether any LAR operation has been performed during the reference time may be determined based on the LAR control signal LARC. The reference time may be determined based on the pulse signal CPLS. The LAR checker 82 may enable the second check signal CHECK2 when any LAR operation has not been performed during the reference time.

The reset signal generator 84 may generate the reset signal RST based on the first check signal CHECK1 and the second check signal CHECK2. The reset signal generator 84 may enable the reset signal RST when both of the first and second check signals CHECK1 and CHECK2 are enabled. In this case, the reset signal generator 84 may include AND gate. The reset signal generator 84 may enable the reset signal RST when the access count ACNT is less than the second reference count and no LAR operation is performed during the reference time.

Figure 6:
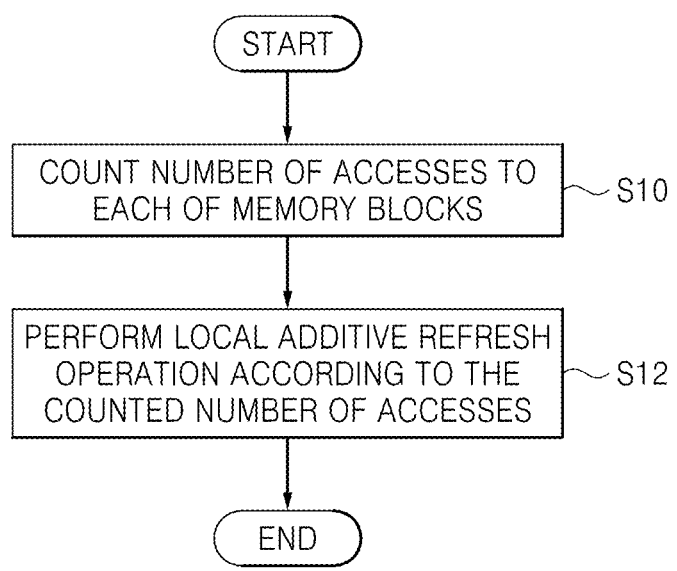
FIG. 6 is a flowchart of a method of refreshing a memory device according to some embodiments of the inventive concept.

FIG. 6 is a flowchart of a method of refreshing the memory device 100 according to some embodiments of the inventive concept. Referring to FIGS. 1 through 6, the LAR start control block 70 may count the number of accesses to a corresponding one of the memory blocks 52 in operation S10. The number of accesses may be counted based on the decoded row address DRA.

The LAR start control block 70 may compare the access count value with the first reference count and output the start signal START according to the comparison result. The LAR control signal generator 74 may generate the LAR control signal LARC based on the start signal START.

A corresponding one of the row decoders 37 may receive the LAR control signal LARC and may perform a LAR operation on the memory block 52 having the access count value exceeding the first reference count base on the LAR control signal LARC in operation S12.

Figure 7:
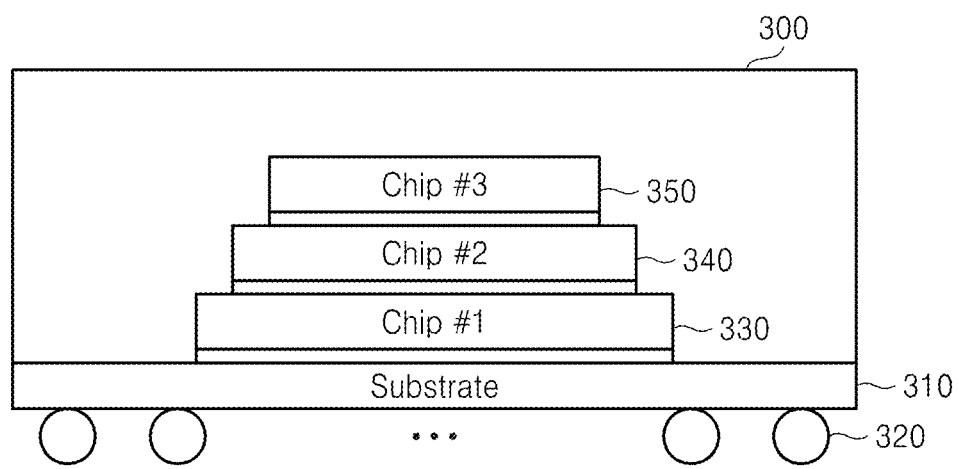
FIG. 7 is a conceptual diagram of a package including the memory device illustrated in FIG. 1 according to some embodiments of the inventive concept.

FIG. 7 is a conceptual diagram of a package 300 including the memory device 100 illustrated in FIG. 1 according to some embodiments of the inventive concept. Referring to FIGS. 1 and 7, the package 300 may include a plurality of semiconductor devices 330, 340, and 350 which are sequentially stacked on a package substrate 310. Each of the semiconductor devices 330 through 350 may be the memory device 100.

The package 300 may be implemented by a package on package (PoP), a ball grid array (BGA), a chip scale package (CSP), a plastic leaded chip carrier (PLCC), a plastic dual in-line package (PDIP), a die in wafer form, a chip on board (COB), a ceramic dual in-line package (CERDIP), a plastic metric quad flat pack (MQFP), a thin quad flat pack (TQFP), a small outline integrated circuit (SOIC), a shrink small outline package (SSOP), a thin small outline package (TSOP), a system in package (SIP), a multi chip package (MCP), a wafer-level package (WLP), or a wafer-level processed stack package (WSP).

A memory controller (not shown) may be implemented within at least one of the semiconductor devices 330 through 350 or may be implemented on the package substrate 310. An electrical vertical connection means, e.g., a through-silicon via (TSV), may be used to electrically connect the semiconductor devices 330 through 350 with one another.

The package 300 may be implemented as a hybrid memory cube (HMC) having a structure in which the memory controller and a memory cell array die are stacked. When the package 300 is implemented as the HMC, the performance of the memory device 100 increases due to the increase of a bandwidth and an area occupied by the memory device 100 is minimized. As a result, power consumption and manufacturing cost are reduced.

Figure 8:
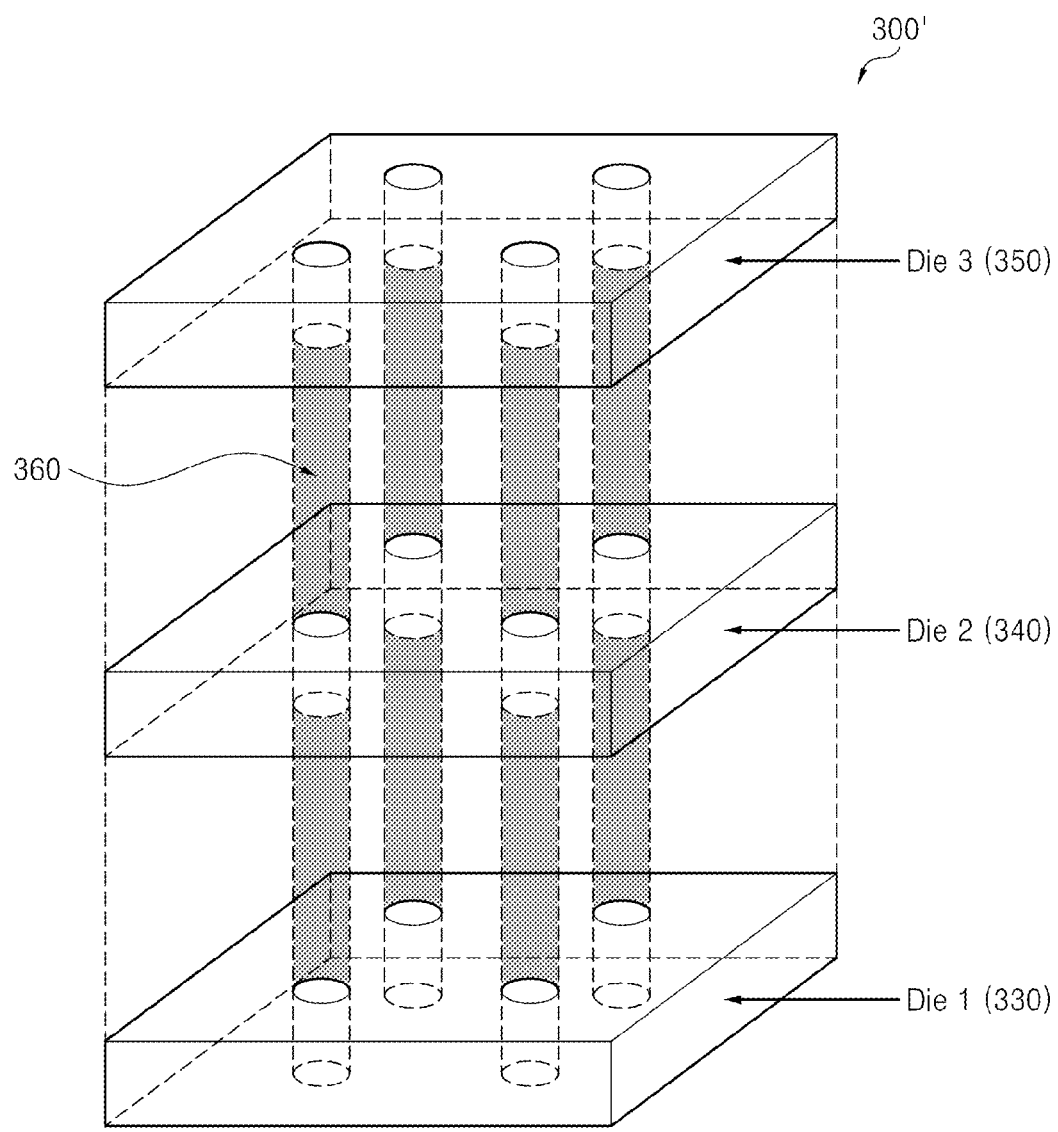
FIG. 8 is a conceptual diagram of a three-dimensional package including the memory device illustrated in FIG. 1 according to some embodiments of the inventive concept.

FIG. 8 is a conceptual diagram of a three-dimensional package 300' including the memory device 100 illustrated in FIG. 1 according to some embodiments of the inventive concept. Referring to FIGS. 1, 7, and 8, the package 300' includes a plurality of dies 330 through 350 connected through a TSV 360 with one another in a stack structure.

Figure 9:
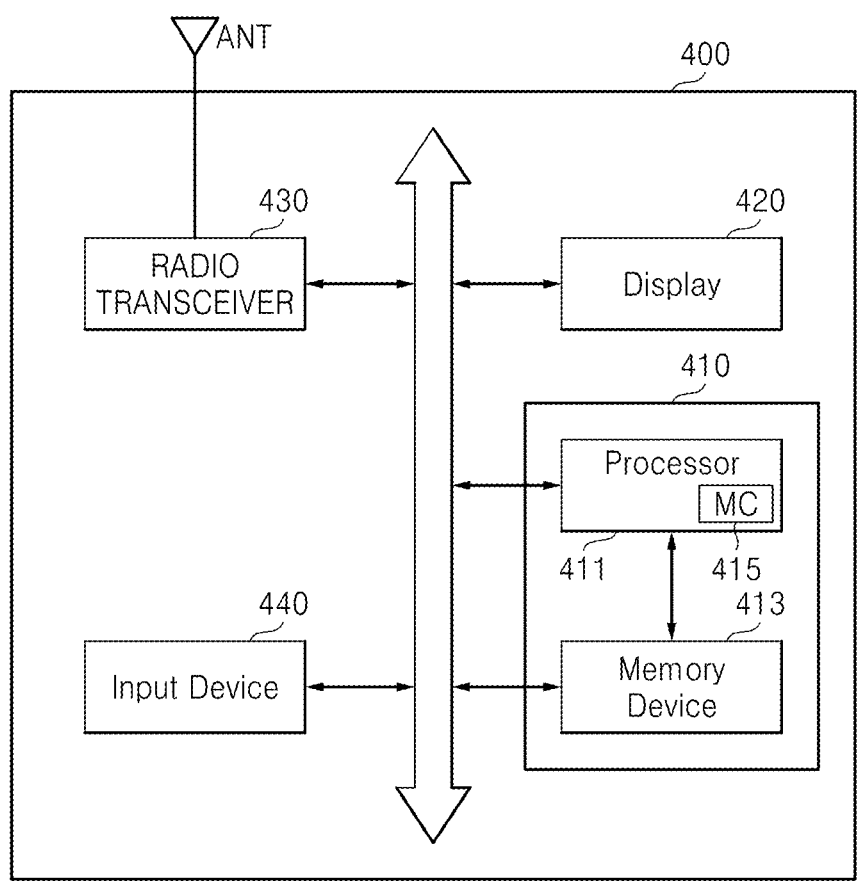
FIG. 9 is a diagram of a system including the memory device illustrated in FIG. 1 according to some embodiments of the inventive concept.

FIG. 9 is a diagram of a system 400 including the memory device 100 illustrated in FIG. 1 according to some embodiments of the inventive concept. Referring to FIGS. 1, 7, and 9, the system 400 may be implemented as an electronic device or a portable device. The portable device may be a cellular phone, a smart phone, or a tablet personal computer (PC).

The system 400 includes a processor 411 and a memory device 413. The memory device 413 may be the memory device 100 illustrated in FIG. 1. The processor 411 and the memory device 413 may be packaged into a package 410. In this case, the package 410 may be mounted on a system board (not shown). The package 410 may be the package 300 illustrated in FIG. 7 or the package 300' illustrated in FIG. 8.

The processor 411 may include a memory controller (MC) 415 that may control the data process operation, e.g., the write operation or the read operation, of the memory device 413. The memory controller 415 is controlled by the processor 411 that controls the overall operation of the system 400. In other embodiments, the memory controller 415 may be connected between the processor 411 and the memory device 413. Data stored in the memory device 413 may be displayed through a display 420 according to the control of the processor 411.

A radio transceiver 430 may transmit or receive radio signals through an antenna ANT. The radio transceiver 430 may convert radio signals received through the antenna ANT into signals that can be processed by the processor 411. Accordingly, the processor 411 may process the signals output from the radio transceiver 430 and store the processed signals in the memory device 413 or display the processed signals through the display 420. The radio transceiver 430 may also convert signals output from the processor 411 into radio signals and output the radio signals to an external device through the antenna ANT.

An input device 440 enables control signals for controlling the operation of the processor 411 or data to be processed by the processor 411 to be input to the system 400. The input device 440 may be implemented by a pointing device such as a touch pad or a computer mouse, a keypad, or a keyboard.

The processor 411 may control the operation of the display 420 to display data output from the memory device 413, radio signals output from the radio transceiver 430, or data output from the input device 440.

Figure 10:
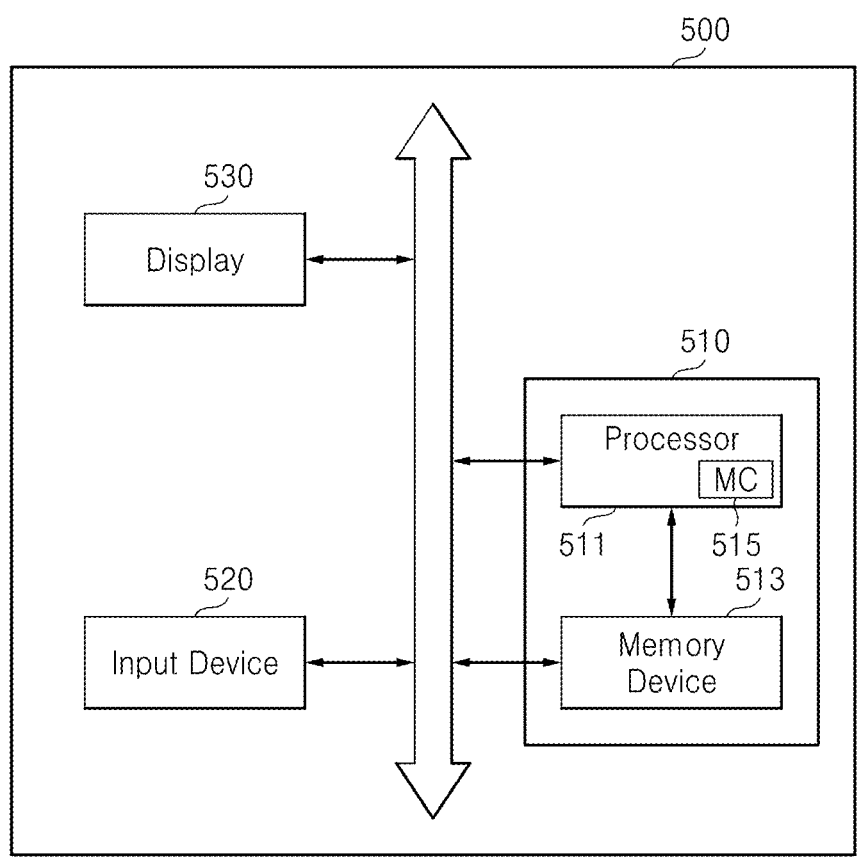
FIG. 10 is a diagram of a system including the memory device illustrated in FIG. 1 according to other embodiments of the inventive concept.

FIG. 10 is a diagram of a system 500 including the memory device 100 illustrated in FIG. 1 according to other embodiments of the inventive concept. Referring to FIGS. 1, 7, 8, and 10, the system 500 may be implemented as a PC, a tablet PC, a netbook, an e-reader, a personal digital assistant (PDA), a portable multimedia player (PMP), an MP3 player, or an MP4 player.

The system 500 includes a processor 511 and a memory device 513. The memory device 513 may be the memory device 100 illustrated in FIG. 1. The processor 511 and the memory device 513 may be packaged into a package 510. In this case, the package 510 may be mounted on a system board (not shown). The package 510 may be the package 300 illustrated in FIG. 7 or the package 300' illustrated in FIG. 8.

The processor 511 may include an memory controller 515 controlling the operation of the memory device 513. The processor 511 may display data stored in the memory device 513 through a display 530 according to an input signal generated by an input device 520. The input device 520 may be implemented by a pointing device such as a touch pad or a computer mouse, a keypad, or a keyboard.

Figure 11:
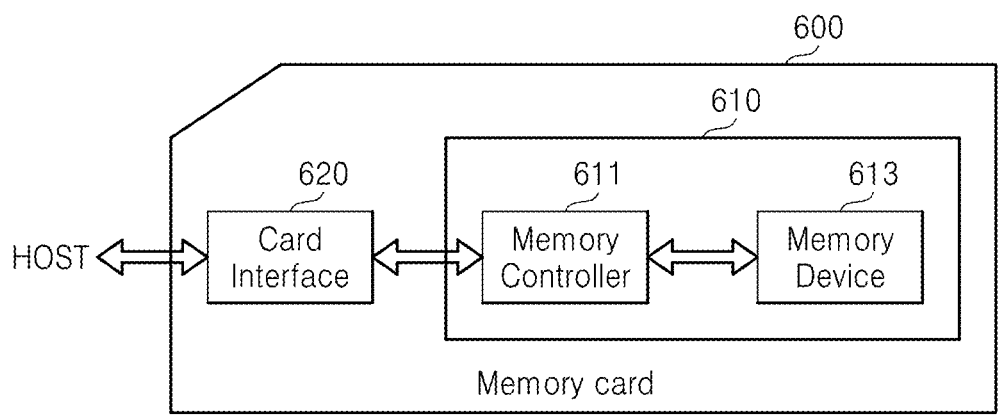
FIG. 11 is a diagram of a system including the memory device illustrated in FIG. 1 according to further embodiments of the inventive concept.

FIG. 11 is a diagram of a system 600 including the memory device 100 illustrated in FIG. 1 according to further embodiments of the inventive concept. Referring to FIGS. 1, 7, 8, and 11, the system 600 may be implemented as a memory card or a smart card.

The system 600 includes a memory device 613, an memory controller_611, and a card interface 620. The memory device 613 may be the memory device 100 illustrated in FIG. 1. The memory device 613 and the memory controller 611 may be packaged into a package 610. In this case, the package 610 may be mounted on a system board (not shown). The package 610 may be the package 300 illustrated in FIG. 7 or the package 300' illustrated in FIG. 8.

The memory controller 611 may control data exchange between the memory device 613 and the card interface 620. The card interface 620 may be a secure digital (SD) card interface or a multi-media card (MMC) interface, but the inventive concept is not restricted to the current embodiments. The card interface 620 may interface a host and the memory controller 611 for data exchange according to a protocol of the host.

When the system 600 is connected with the host such as a computer, a digital camera, a digital audio player, a cellular phone, a console video game hardware, or a digital set-top box, the host may perform data communication with the memory device 613 through the card interface 620 and the memory controller 611.

Figure 12:
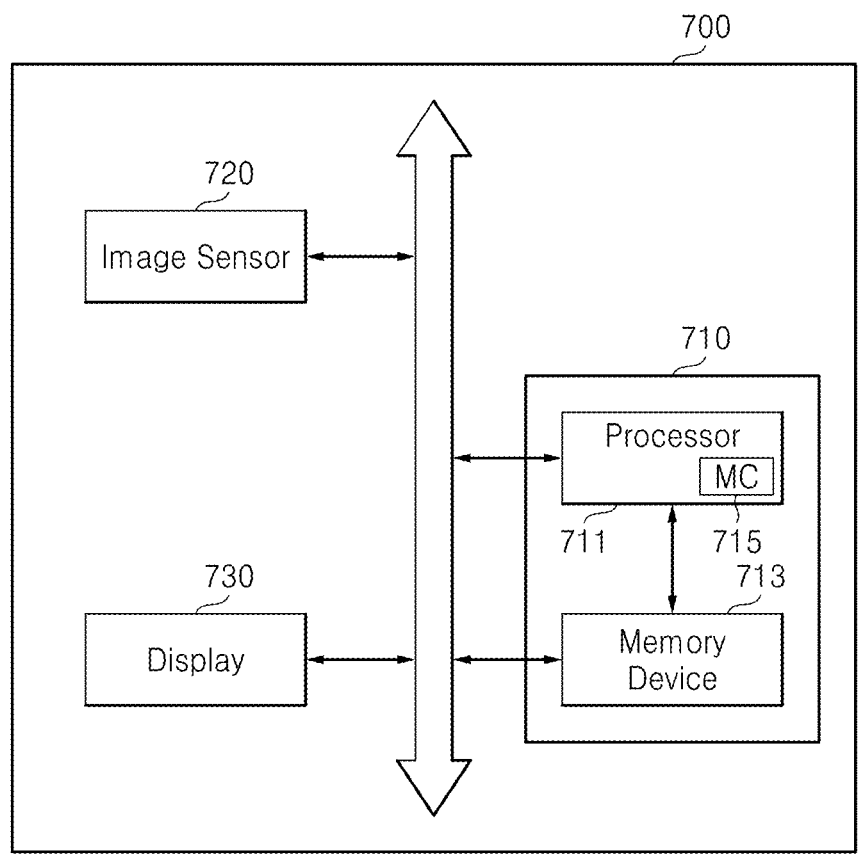
FIG. 12 is a diagram of a system including the memory device illustrated in FIG. 1 according to other embodiments of the inventive concept.

FIG. 12 is a diagram of a system 700 including the memory device 100 illustrated in FIG. 1 according to other embodiments of the inventive concept. Referring to FIGS. 1, 7, 8, and 12, the system 700 may be implemented as a digital camera or a portable device equipped with the digital camera. The system 700 includes a processor 711 controlling the overall operation of the system 700 and a memory device 713. At this time, the memory device 713 may be the memory device 100 illustrated in FIG. 1.

The processor 711 and the memory device 713 may be packaged into a package 710. In this case, the package 710 may be mounted on a system board (not shown). The package 710 may be the package 300 illustrated in FIG. 7 or the package 300' illustrated in FIG. 8.

An image sensor 720 included in the system 700 converts optical images into digital signals. The digital signals are stored in the memory device 713 or displayed through a display 730 according to the control of the processor 711. The digital signals stored in the memory device 713 are displayed through the display 730 according to the control of the processor 711.

Figure 13:
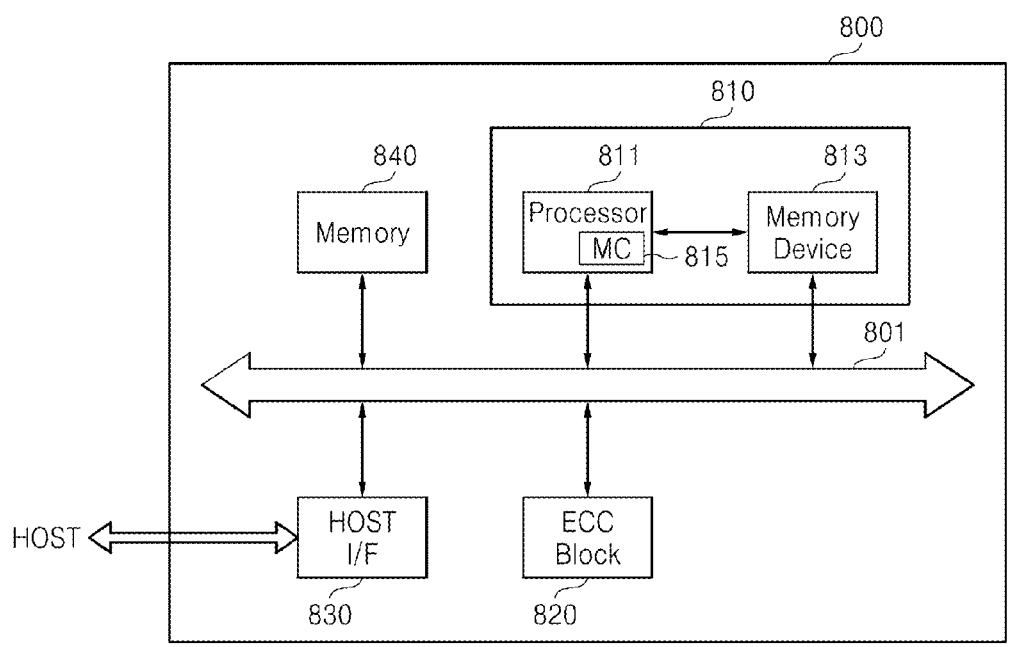
FIG. 13 is a diagram of a system including the memory device illustrated in FIG. 1 according to yet other embodiments of the inventive concept.

FIG. 13 is a diagram of a system 800 including the memory device 100 illustrated in FIG. 1 according to yet other embodiments of the inventive concept. Referring to FIGS. 1, 7, 8, and 13, the system 800 includes a memory device 813 and a processor 811 controlling the overall operation of the system 800. At this time, the memory device 813 may be the memory device 100 illustrated in FIG. 1.

The memory device 813 and the processor 811 may be packaged into a package 810. In this case, the package 810 may be mounted on a system board (not shown). The package 810 may be the package 300 illustrated in FIG. 7 or the package 300' illustrated in FIG. 8.

The processor 811 includes an memory controller 815 controlling the operation of the memory device 813. The system 800 also includes a memory 840 that may be used as an operation memory of the processor 811. The memory 840 may be implemented by a non-volatile memory such as read-only memory (ROM) or flash memory.

A host connected with the system 800 may communicate data with the memory device 813 through the processor 811 and a host interface (I/F) 830. At this time, the memory controller 815 may function as a memory I/F. The system 800 may also include an error correction code (ECC) block 820.

The ECC block 820 is controlled by the processor 811. The ECC block 820 may detect and correct an error in data read from the memory device 813 through the memory controller 815.

The processor 811 may control data exchange among the ECC block 820, the host I/F 830, and the memory 840 through a bus 801. The system 800 may be implemented as a universal serial bus (USB) memory drive or a memory stick.

Figure 14:
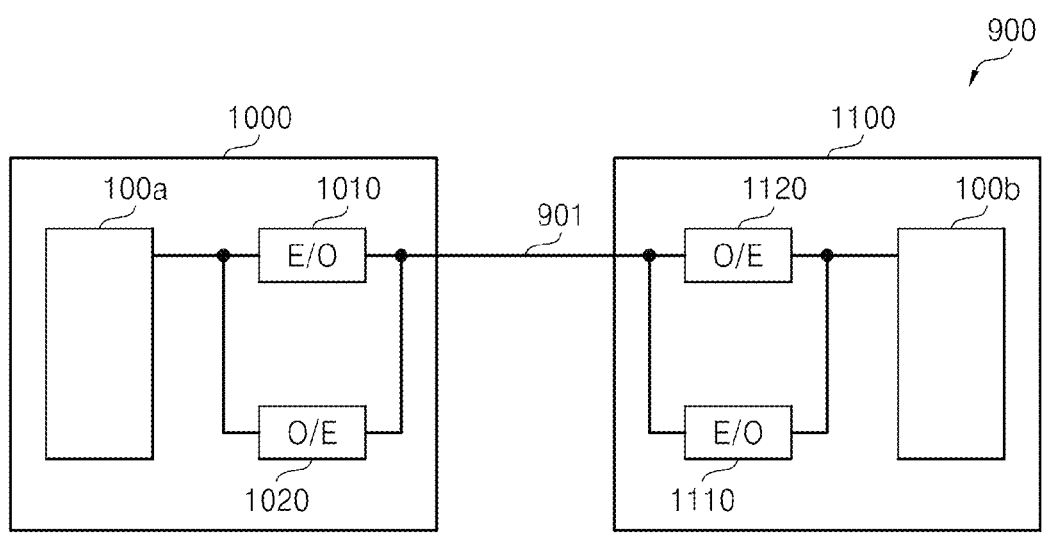
FIG. 14 is a diagram of a system including the memory device illustrated in FIG. 1 according to still other embodiments of the inventive concept.

FIG. 14 is a diagram of a system 900 including the memory device 100 illustrated in FIG. 1 according to still other embodiments of the inventive concept. A channel 901 may be an optical connection means. The optical connection means may be an optical fiber, an optical waveguide, or a medium that transmits an optical signal.

Referring to FIGS. 1 and 14, the system 900 may include a first system 1000 and a second system 1100. The first system 1000 may include a first memory device 100a and an electro-optic (E/O) conversion circuit 1010. The E/O conversion circuit 1010 may convert an electrical signal output from the first memory device 100a into an optical signal and output the optical signal to the second system 1100 through the optical connection means 901.

The second system 1100 may include an opto-electric (O/E) conversion circuit 1120 and a second memory device 100b. The O/E conversion circuit 1120 may converts an optical signal input through the optical connection means 901 into an electrical signal and transmit the electrical signal to the second memory device 100b.

The first system 1000 may also include an O/E conversion circuit 1020 and the second system 1100 may also include an E/O conversion circuit 1110. When the second system 1100 transmit data to the first system 1000, the E/O conversion circuit 1110 may convert an electrical signal output from the second memory device 100b into an optical signal and output the optical signal to the first system 1000 through the optical connection means 901. The O/E conversion circuit 1020 may convert the optical signal received through the optical connection means 901 into an electrical signal and transmit the electrical signal to the first memory device 100a. The structure and the operation of the memory devices 100a and 100b are substantially the same as those of the memory device 100 illustrated in FIG. 1.

As described above, according to some embodiments of the inventive concept, an additional refresh operation is performed on a memory block having the number of accesses exceeding a reference count, thereby repairing a dynamic weak row included in the memory block. In addition, an access count value resulting from counting the number of accesses is reset when the additional refresh operation is unnecessary, thereby reducing power consumption.

While the inventive concept has been particularly shown and described with reference to exemplary embodiments thereof, it will be understood by those of ordinary skill in the art that various changes in forms and details may be made therein without departing from the spirit and scope of the inventive concept as defined by the following claims.

What is claimed is:

1. A method of refreshing a memory device, the method comprising, for each of a plurality of memory blocks of the memory device:
   counting a number of accesses to the memory block;
   comparing the counted number of accesses resulting from the counting with a first reference count;
   performing an additional refresh operation of the memory block in response to the comparing; and
   performing a normal refresh operation according to a schedule of the plurality of memory blocks,
   wherein the additional refresh operation is performed while the normal refresh operation is being performed.

2. The method of claim 1, wherein the additional refresh operation uses an address used to perform the normal refresh operation.

3. The method of claim 1, wherein the performing the additional refresh operation comprises generating a start signal for starting the additional refresh operation on the corresponding memory block when the counted number of accesses to the corresponding memory block is equal to or greater than the first reference count according to the comparison result.

4. The method of claim 3, wherein the performing the additional refresh operation further comprises:
   counting a number of sequential additional refresh operations after generating the start signal.

5. The method of claim 4, wherein the performing the additional refresh operation further comprises:
   comparing the counted number of additional refresh operations with a number equal to a number of word lines in the corresponding memory block.

6. The method of claim 5, wherein the counted number of additional refresh operations is reset upon determining the counted number of accesses to the corresponding memory block is equal to or greater than the first reference count according to the comparison result.

7. The method of claim 1, further comprising:
   comparing the counted number of accesses with a second reference count during a reference time; and
   resetting the counted number of accesses according to the comparison result of the counted number of accesses with the second reference count during the reference time,
   wherein the second reference count is less than the first reference count.

8. The method of claim 7, wherein the resetting the counted number of accesses comprises resetting the counted number of accesses only when no additional refresh operation is performed during the reference time.

9. A memory device comprising:
   a plurality of memory blocks;
   a local additive refresh start control circuit configured to compare a number of accesses of each of the plurality of memory blocks with a first reference count and to generate a corresponding start signal according to the corresponding comparison result; and
   a local additive refresh control signal generator configured to generate a plurality of control signals, each control signal configured to cause an additional refresh operation on a corresponding one of the memory blocks according to the corresponding start signal,
   wherein the focal, additive refresh control signal generator is configured to cause the additional refresh operation to be performed while a normal refresh operation is being performed.

10. The memory device of claim 9, wherein the additional refresh operation is performed by at least a first memory block.

11. The memory device of claim 9, wherein the local additive refresh start control circuit is configured to generate a detection signal indicating whether the number of accesses exceeds the first reference count according to the comparison result.

12. The memory device of claim 11, further comprising a local additive refresh end control circuit configured to count a number of sequential additional refresh operations performed in response to the generation of the detection signal and to generate an end signal for terminating further additional refresh operations according to the count.

13. A memory system comprising:
   the memory device of claim 9; and
   a memory controller configured to control the memory device.

14. A method of refreshing a memory device, the memory device comprising a plurality of memory blocks, each memory block comprising a plurality of rows, the method comprising:
   performing normal refresh operations comprising refreshing the plurality of rows of the memory blocks according to a predetermined sequence;
   monitoring accesses of the memory blocks; and
   performing additional refresh operations of a first memory block of the memory blocks when the accesses of the first memory block exceed a threshold while refreshing a second memory block of the memory blocks according to the predetermined sequence of the normal refresh operations.

15. The method of claim 14, wherein the predetermined sequence is determined by a refresh counter circuit generating refresh row addresses for the normal refresh operations.

16. The method of claim 15, further comprising using at least part of the refresh row addresses output by the refresh counter circuit to perform the additional refresh operations.

17. The method of claim 14, further comprising refreshing a first row of the first memory block simultaneously with refreshing a second row of the second memory block.

* * * * *